Figure 1:
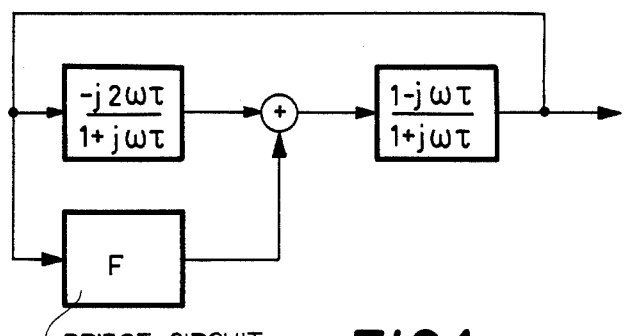

United States Patent [19]

Meyer-Ebrecht

[11] Patent Number: 4,794,350
[45] Date of Patent: Dec. 27, 1988

[54] CIRCUIT ARRANGEMENT FOR CONVERTING A RESISTANCE VARIATION INTO A FREQUENCY VARIATION

[75] Inventor: Dietrich Meyer-Ebrecht, Hamburg, Fed. Rep. of Germany

[73] Assignee: U.S. Philips Corporation, New York, N.Y.

[21] Appl. No.: 220,931

[22] Filed: Dec. 29, 1980

[30] Foreign Application Priority Data

Jan. 5, 1980 [DE] Fed. Rep. of Germany ....... 3000291

[51] Int. Cl.$^4$ .......................... G01R 27/02; H03B 5/20
[52] U.S. Cl. ...................................... 331/65; 331/135; 331/138
[58] Field of Search .......................... 331/65, 138–140, 331/110, 108 B; 324/DIG. 1, 65 R, 98; 318/663; 338/13, 2, 17; 323/365–367

[56] References Cited

U.S. PATENT DOCUMENTS

| | | | |
|---|---|---|---|
| 2,782,311 | 2/1957 | Colander et al. ................... | 331/138 |
| 3,127,577 | 6/1960 | Lapointe ............................. | 331/110 |
| 3,845,385 | 10/1974 | Ebrecht ............................. | 331/65 X |
| 3,933,046 | 1/1976 | Ebrecht ............................. | 331/140 |
| 4,006,430 | 2/1977 | Ebrecht ........................... | 331/138 X |

OTHER PUBLICATIONS

Wait, "Introduction to Operational Amplifier Theory and Applications", pp. 68–69 and 47–48, 1975.
Millman, "Microelectronics" p. 580, 1979.
Philips Research Report Supplements, 1974 No. 6 pp. 56–57.

Primary Examiner—Siegfried H. Grimm
Assistant Examiner—Tim A. Wiens
Attorney, Agent, or Firm—Bernard Franzblau

[57] ABSTRACT

A simple circuit for converting the resistance variations of a strain gauge measuring bridge into a frequency variation of an oscillator. The circuit includes first and second phase shift circuits connected in cascade in a feedback loop with a frequency-independent device having a variable gain factor F connected in parallel with the first phase shift circuit. The first phase shift circuit includes a high pass filter and a summing amplifier and the second phase shift circuit includes an all-pass filter circuit.

16 Claims, 2 Drawing Sheets

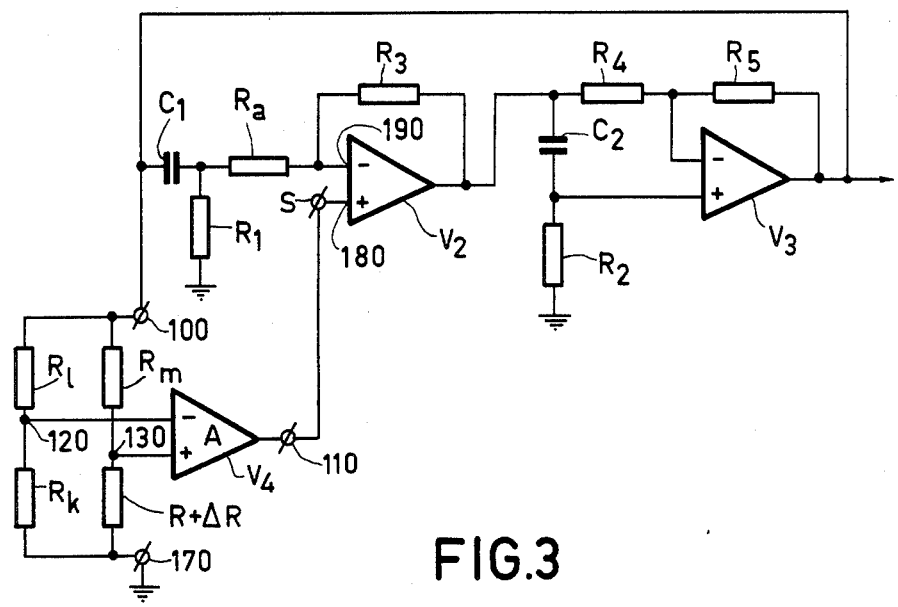
FIG.3
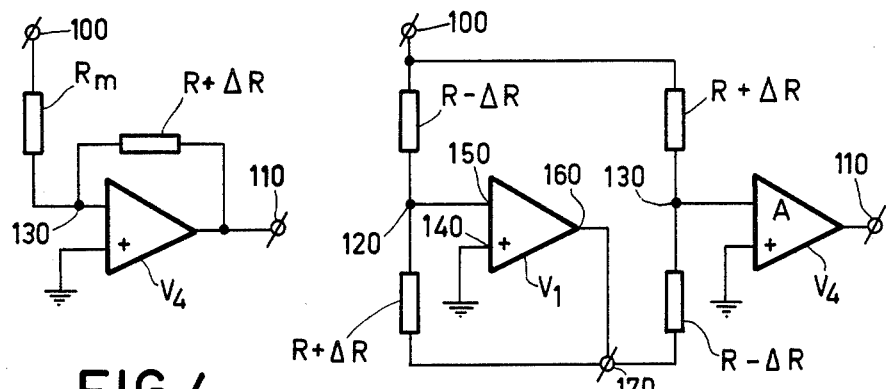
FIG.4
FIG.5

CIRCUIT ARRANGEMENT FOR CONVERTING A RESISTANCE VARIATION INTO A FREQUENCY VARIATION

The invention relates to a circuit arrangement for converting a resistance variation into a frequency variation, which arrangement comprises at least one resistance which depends on a physical quantity and an oscillator comprising an all-pass filter with an operational amplifier.

Numerous circuit arrangements are known by means of which resistance variations, for example, of strain gauges, can be converted into frequency variations. Especially in the weighing technology such circuit arrangements are frequently used. In all cases where weighing devices that can be calibrated are concerned very stringent requirements are imposed on the resolution and linearity, which demands a corresponding amount of additional circuitry.

However, there are also applications where a minimal amount of circuitry and thus a minimal price are more important, for example, in the case of domestic weighing devices or person weighing devices. In that case less stringent requirements are imposed on the accuracy, which may be in the per thousand or even in the percent range.

It is an object of the present invention to provide a simple circuit arrangement of the type mentioned in the opening paragraph which is particularly suitable for the said applications, i.e. which requires a small number of circuit elements and which mainly comprises non-critical, that is mass produced, components.

A solution to this problem is that the oscillator further comprises a high-pass filter with a summing amplifier ($V_2$) and there is included a frequency-independent element (whose gain factor depends on the resistance variation) coupled between the output of the operational amplifier following the all-pass filter and the summing point of the summing amplifier following the high-pass filter.

According to the invention the frequency-independent element may comprise a bridge circuit which includes at least one resistance which depends on the physical quantity, and at least one operational amplifier for amplifying the output voltage of the bridge circuit.

Suitably the said bridge circuit is a strain-gauge measuring bridge.

In this respect it is to be noted that all-pass circuits of the aforesaid type have already been described several times, as for example in "Electronic Engineering", August 1967, pages 498 to 502; NASA Tech. Brief No. 70-10338; and "Philips Research Report Supplements" 1974, No. 6, pages 56 to 57.

Figure 2:
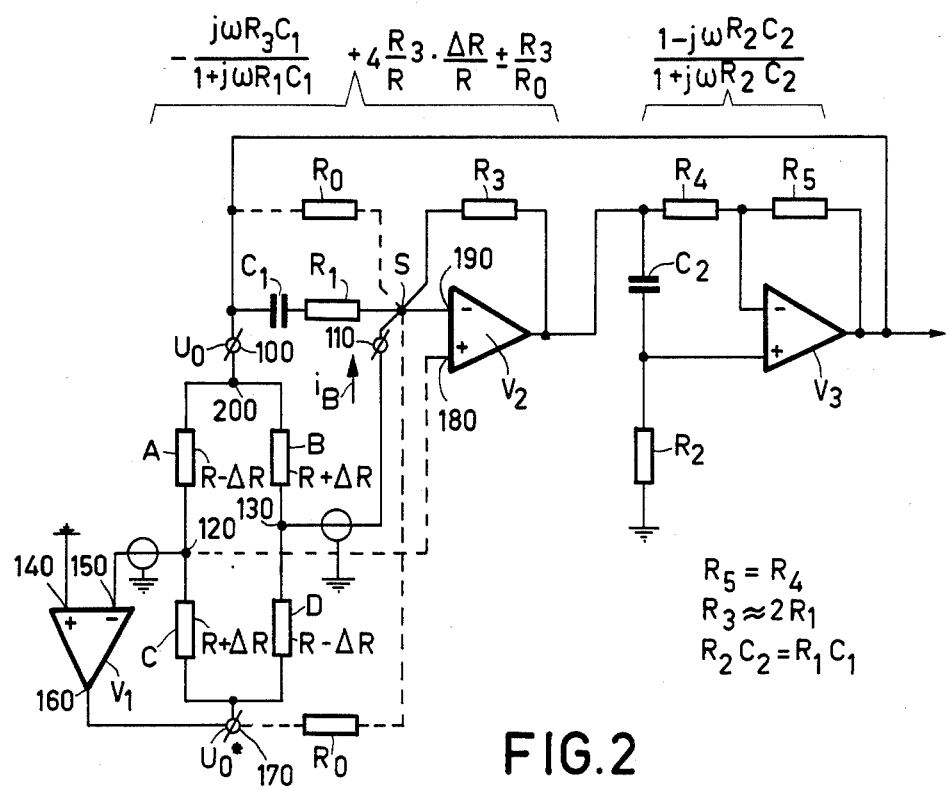

Some embodiments of the invention now will be described in more detail with reference to the accompanying drawings. In the drawing:

FIG. 1 schematically represents a circuit arrangement in accordance with the invention, FIG. 2 shows an elaborate circuit diagram of said circuit arrangement, FIG. 3 shows another embodiment of said circuit arrangement, and FIGS. 4 and 5 show examples of bridge circuits which may be used.

The sinewave oscillator, which is symbolically represented in FIG. 1, comprises a high-pass network with the transfer function $$\frac{j2\omega\tau}{1+j\omega\tau}$$

and an all-pass network $$\frac{1-j\omega\tau}{1+j\omega\tau},$$

as well as a further branch with a frequency-independent gain factor F. This oscillator has the special feature that its operating frequency $\omega_0$ can be controlled by merely varying the gain factor F, namely as a substantially linear function of the gain factor F over a frequency range which is adequate for processing the output signal and without a variation of the loop gain of the oscillator in the case of a variation of the gain factor F.

As a sinewave oscillator this circuit arrangement comprises no threshold switches or any other non-linear elements which may additionally influence the frequency.

The resonant frequency $\omega_0$ is a non-linear function of F:

$$\omega_0 = \frac{1}{\tau}\sqrt{\frac{1+F}{3-F}}, \text{ where } \tau = R_1 \cdot C_1 = R_2 \cdot C_2, \quad (1)$$

but this function has a point of inflection for F=0, so that for example a frequency variation of ±30% ($\omega_{0max} \approx 2\omega_{0min}$) results in a maximum deviation from a linear characteristic of only ±0.3%, F varying between substantially $-\frac{1}{2}$ and $+\frac{1}{2}$.

FIG. 2 shows a detailed circuit diagram of a circuit arrangement in accordance with the invention. A high-pass filter comprises a summing amplifier $V_2$, a first resistor $R_1$ and a first capacitor $C_1$, the summing amplifier $V_2$ receiving negative feedback via a resistor $R_3$. Said high-pass filter is followed by an all-pass filter (amplifier with a comparatively constant gain factor 1, but with a frequency-dependent phase shift), which comprises an operational amplifier $V_3$, a further resistor $R_2$ and a further capacitor $C_2$. The amplifier $V_3$ receives negative feedback via resistors $R_4$ and $R_5$.

The modulating branch with the gain factor F is realized as follows. The input circuit of the summing amplifier $V_2$ includes a bridge circuit comprising four strain gauges A, B, C, D, whose input terminals 200 and 170 are connected to a feedback branch from the output of the operational amplifier $V_3$ to the first capacitor $C_1$ via an input terminal 100 and to the output 160 of an inverting amplifier $V_1$. The output terminals 120 and 130 of this bridge circuit are respectively connected to the inverting input 150 of the inverting amplifier $V_1$ and to the summing point of the summing amplifier $V_2$ via an output terminal 110.

For shifting the zero point, that is for adjustment to a specific initial frequency when the bridge unbalance is zero, there may be provided a resistor $R_0$, whose one terminal is also connected to the summing point S and whose other terminal is connected to the bridge point 200 ($U_0$) or to the bridge point 170 ($U_0^*$) depending on the shifting direction.

In the loaded condition the values of the bridge resistances A, B, C, D change, for example as is represented in FIG. 2. As a result of this, the bridge is unbalanced, the gain factor F varies and thus the frequency generated by the oscillator.

The operation of the proposed circuit arrangement is as follows. As the bridge A, B, C, D is symmetrically energized via the inverting amplifier $V_1$, the detuning of the corresponding bridge half B, D determines the gain factor F. The opposite detuning of the second bridge half A, C is added to the gain factor F, because it constitutes the load of the inverting amplifier $V_1$:

$$U_0^* = -U_0 \frac{R + \Delta R}{R - \Delta R} \approx -U_0 \left(1 + 2\frac{\Delta R}{R}\right)$$

$$i_B = \frac{U_0}{R + \Delta R} + \frac{U_0^*}{R - \Delta R} \approx -4\frac{\Delta R}{R} \cdot \frac{U_0}{R}$$

(This approximation is valid for $\Delta R \ll R$.)

In this calculation it is assumed that the bridge output terminal 120 connected to the input 150 of the inverting amplifier $V_1$ adopts the reference potential owing to its function ("virtual ground" of the summing point of an operational amplifier). A deviation is compensated for in that the reference potential of the summing amplifier $V_2$ following the bridge is taken from this bridge output terminal.

The resistor $R_0$ gives an additional zero-point shift of the frequency in the positive or negative direction, depending on whether $R_0$ is connected to $U_0^*$ or to $U_0$ respectively, so that $$F = \frac{8 \cdot R_1}{R} \cdot \frac{\Delta R}{R} \pm \frac{2 \cdot R_1}{R_0} \quad (2)$$

Capacitive influences of the bridge input lines can be substantially avoided by screening the bridge outputs from the reference potential so that no capacitive currents are possible between input and output terminals. Because of the symmetrical power supply the potentials on the output terminals are low and capacitive currents to the reference potential are consequently small.

In order to obtain a steady amplitude during operation of the oscillator, it is necessary to provide means for amplitude stabilisation by controlling or non-linearising an amplifier characteristic.

The described circuit arrangement has several advantages. First of all it demands only a small number of amplifiers. Moreover, the frequency is determined by a small number of passive components, and an amplifier which directly follows the measuring bridge may be dispensed with. Furthermore, the influence of the measuring-bridge lead capacitances is greatly reduced and, which is of particular importance, the circuit can be integrated by conventional technology.

If the proposed circuit arrangement comprises operational amplifiers with low quiescent currents (for example in MOS technology), their operating current is almost exclusively determined by the strain gauges A, B, C, D. During operation of the bridge circuit with the sinewave voltage from the oscillator, the supply line of the oscillator carries a current containing a component with twice the oscillator frequency. If this frequency is coupled out, for example by means of an opto-coupler at the location of the power supply, a remote measuring system can be realized very simply without the use of additional modulating circuits. In this system the oscillator in the measuring station is connected to the power supply device in the processing station via a single two-wire lead.

In the circuit arrangement shown in FIG. 2 the summing point S constitutes a current-summing point, the potential at the input 190 being equal to the potential at the input 180, i.e. equal to ground potential.

The summing point S may alternatively be a voltage-summing point, if the two inputs of the amplifier $V_2$ are employed as differential inputs, as is shown in FIG. 3.

In FIG. 3 the output voltage of the high-pass filter $C_1$—$R_1$ is applied to the one high-ohmic input of the operational amplifier circuit $R_a$—$V_2$—$R_3$ and the input 180 constitutes the summing point S. The bridge circuit is a Wheatstone bridge with 3 fixed resistors $R_k$, $R_l$, $R_m$ and with one measuring resistor $R + \Delta R$. The output voltage of the bridge at the terminals 120, 130 is applied to an amplifier circuit $V_4$ having a gain factor A. If the aforementioned requirements for the frequency swing are satisfied and $\Delta R$ is selected to be much smaller than $R + R_m$, the following relationship is obtained:

$$\frac{1}{6} \cdot \frac{R}{\Delta R} \approx B(1 - B) \cdot A \quad (3)$$

$$\text{in which } B = \frac{R_k}{R_k + R_l} = \frac{R}{R + R_m}$$

It is to be noted that the bridge circuit of FIG. 3 may also be used in the circuit arrangement of FIG. 2, in which case $V_1$ of FIG. 2 is needed whereas $V_4$ of FIG. 3 is not. Then, it follows that:

$$\frac{1}{6} \cdot \frac{R}{\Delta R} \approx \frac{2}{3} \cdot \frac{R_1}{R_m} \gg 1 \quad (4)$$

In the arrangement of FIG. 3 it is alternatively possible to use an inverting amplifier $V_1$, as is shown in FIG. 2 and also in FIG. 5. The relationship then becomes:

$$\frac{1}{6} \cdot \frac{R}{\Delta R} \approx \frac{B}{1 - B} \cdot A \quad (5)$$

In FIG. 4 the bridge circuit is a half bridge with only one measuring resistor. In this case:

$$\frac{1}{6} \cdot \frac{R}{\Delta R} \approx \frac{R}{R + R_m}, \text{ in which } R_m > 2R \quad (6)$$

FIG. 5 shows the measuring bridge of FIG. 2, but adapted to voltage measurements in accordance with the arrangement of FIG. 3. In this case the same requirements for the frequency swing (factor 2) are adopted, so that:

$$\frac{1}{6} \cdot \frac{R}{\Delta R} \approx 2A \quad (7)$$

What is claimed is:

1. An oscillator circuit for converting a resistance variation into a frequency variation comprising, a high pass filter and a summing amplifier connected in cascade, an all-pass filter connected in cascade with an operational amplifier, means connecting the high pass filter and summing amplifier in cascade with the all-pass filter and the operational amplifier in a closed loop feedback circuit with the output of the operational amplifier coupled to an input of the high pass filter, a frequency-independent device coupled across said high pass filter and including at least one resistance element whose resistance depends on a physical quantity, the gain factor F of the frequency-independent device being dependent on a resistance variation of said one resistance element.

2. A circuit as claimed in claim 1 wherein the frequency-independent device comprises a bridge circuit that includes said at least one resistance element which depends on a physical quantity, and at least one operational amplifier coupling an output terminal of the bridge circuit to a supply terminal of the bridge circuit for amplifying the output voltage of the bridge circuit.

3. A circuit as claimed in claim 2, wherein a first input of said one operational amplifier is connected to a reference potential and a second input thereof is connected to a first diagonal output terminal of the bridge circuit, and means connecting an output of said one operational amplifier to a supply terminal of the bridge circuit and the other bridge circuit supply terminal to the input of the high pass filter.

4. A circuit as claimed in claim 3, wherein a second bridge circuit diagonal output terminal is connected to one input of the summing amplifier via a summing point, and means coupling an other input of the summing amplifier to the second input of the one operational amplifier.

5. A circuit as claimed in claim 3, further comprising a third operational amplifier with a gain factor A having one input connected to a second diagonal output terminal and a second input connected to the reference potential and means coupling an output of the third operational amplifier to an input of the summing amplifier.

6. A circuit as claimed in claim 1, wherein the frequency-independent device comprises a bridge circuit that includes said one resistance element, at least one operational amplifier having first and second inputs connected to first and second diagonal output terminals of the bridge circuit and an output connected to an input of the summing amplifier.

7. An oscillator circuit as claimed in claim 1 wherein said frequency-independent device has an input coupled to an input of the high pass filter and an output coupled to an input of the summing amplifier so that the frequency-independent device is in parallel with the high pass filter and receives as its input signal an oscillation signal appearing at an output of the operational amplifier.

8. A variable frequency oscillator circuit for converting a resistance variation into a frequency variation comprising, a frequency control device having an input terminal and an output terminal and a variable resistance element, the gain factor F of said frequency control device being determined by the resistance of said variable resistance element, first and second phase shift networks connected in cascade in a positive feedback loop, said first phase shift network including a high pass filter and a summing amplifier connected in cascade and said second phase shift network including an all-pass filter, and means coupling said input and output terminals of the frequency control device to the first phase shift network with said input terminal of the frequency control device coupled to an input of the high pass filter.

9. An oscillator circuit as claimed in claim 8 wherein the second phase shift network includes a first operational amplifier connected in cascade with said all-pass filter, and wherein said high pass filter includes a resistor with a resistance $R_1$ and a capacitor with a capacitance $C_1$ and said all-pass filter includes a resistor with a resistance $R_2$ and a capacitor with a capacitance $C_2$, and wherein $R_1 C_1 = R_2 C_2$.

10. An oscillator circuit as claimed in claim 9 wherein said summing amplifier and said operational amplifier each include a negative feedback loop intercoupling its output and input terminals.

11. An oscillator circuit as claimed in claim 8 wherein said frequency control device comprises a bridge circuit that includes said variable resistance element.

12. An oscillator circuit as claimed in claim 11 further comprising a first operational amplifier having a first input coupled to a source of reference potential and a second input connected to a first output terminal of the bridge circuit, and means coupling a first input terminal of the bridge circuit to the input terminal of the frequency control device and a second bridge circuit input terminal to an output of the first operational amplifier.

13. An oscillator circuit as claimed in claim 12 wherein a second output terminal of the bridge circuit is coupled to said output terminal of the frequency control device, and means coupling a second input of the summing amplifier to said first output terminal of the bridge circuit.

14. An oscillator circuit as claimed in claim 12 further comprising a second operational amplifier having a gain factor A and one input connected to a second output terminal of the bridge circuit and a second input connected to the source of reference potential, an output of the second operational amplifier being connected to the output terminal of the frequency control device.

15. An oscillator circuit as claimed in claim 11 wherein the second phase shift network includes a first operaional amplifier in cascade with the all-pass filter and further comprising a second operational amplifier having first and second inputs connected to first and second output terminals, respectively, of the bridge circuit, and having an output connected to the output terminal of the frequency control device, and wherein an oscillation signal is developed in said closed loop feedback circuit that flows via the all-pass filter, the first operational amplifier, the high pass filter, the summing amplifier and directly back to the all-pass filter, in the order named.

16. A circuit for converting a resistance variation into a frequency variation comprising, an oscillator comprising first and second phase shifting circuits and amplifying means connected in cascade in a positive feedback loop, a frequency-independent device connected in parallel with the first phase-shifting circuit and having a gain factor F variable in value between $+F_{max}$ and $-F_{max}$, said frequency-independent device including at least one element whose resistance depends on a physical quantity, said first phase-shifting circuit including a high pass filter and a summing amplifier and having a time constant $t_1$, the second phase-shifting circuit including an all-pass filter circuit, and wherein the oscillator frequency, $\omega$, the time constant, $t_1$, and the gain factor F satisfy the relation:

$$(\omega t_1)^2 = \frac{1+F}{3-F}.$$

* * * * *